US012804330B2

(12) United States Patent
Wang et al.

(10) Patent No.: US 12,804,330 B2
(45) Date of Patent: Nov. 17, 2026

(54) MICROPHONE

(71) Applicant: AAC ACOUSTIC TECHNOLOGIES (SHENZHEN) CO., LTD., Shenzhen (CN)

(72) Inventors: Yaqi Wang, Shenzhen (CN); Rui Cai, Shenzhen (CN); Zhongzong Gan, Shenzhen (CN); Xingfu Chen, Shenzhen (CN); Xing Yu, Shenzhen (CN); Rui Zhang, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 145 days.

(21) Appl. No.: 18/764,341

(22) Filed: Jul. 4, 2024

(65) Prior Publication Data

US 2025/0317695 A1 Oct. 9, 2025

Related U.S. Application Data

(63) Continuation of application No. PCT/CN2024/086040, filed on Apr. 3, 2024.

(51) Int. Cl.

| | |
|---|---|
| ***H04R 19/04*** | (2006.01) |
| ***B81B 7/00*** | (2006.01) |
| ***H04R 1/04*** | (2006.01) |
| ***H04R 19/00*** | (2006.01) |

(52) U.S. Cl.

CPC ........... *H04R 19/04* (2013.01); *B81B 7/0061* (2013.01); *H04R 1/04* (2013.01); *H04R 19/005* (2013.01); *B81B 2201/0257* (2013.01); *H04R 2201/003* (2013.01)

(58) Field of Classification Search

CPC ........ H04R 19/04; H04R 1/04; H04R 19/005; H04R 2201/003; H04R 1/08; H04R 9/06; H04R 9/08; H04R 11/04; H04R 17/02; H04R 19/016; H04R 21/02; B81B 7/0061; B81B 2201/0257

USPC ................. 381/113, 115, 369, 170, 171, 175

See application file for complete search history.

(56) References Cited

U.S. PATENT DOCUMENTS

| | | | | |
|---|---|---|---|---|
| 10,189,703 | B2 * | 1/2019 | Ghidoni | B81C 1/0023 |
| 11,102,562 | B2 * | 8/2021 | Ye | H04R 1/083 |
| 2013/0070951 | A1 * | 3/2013 | Tanaka | H04R 1/38 381/361 |
| 2020/0329299 | A1 * | 10/2020 | Miller | H04R 1/1083 |
| 2020/0407215 | A1 * | 12/2020 | Zeng | B81B 7/04 |
| 2025/0033953 | A1 * | 1/2025 | Gupta | H04R 1/406 |
| 2025/0338403 | A1 * | 10/2025 | Wang | H05K 1/0218 |

* cited by examiner

*Primary Examiner* — Xu Mei

(74) *Attorney, Agent, or Firm* — Wiersch Law Group

(57) ABSTRACT

The present disclosure discloses a microphone including a housing, a printed circuit board assembled with the housing for forming a first cavity and a second cavity, a first chip component, a second chip component, and a first metal layer, the first chip component includes a first MEMS chip and a first ASIC chip, the second chip component includes a second MEMS chip and a second ASIC chip, the housing is fixed with a side of the first metal layer away from the printed circuit board. Compared with the related art, a microphone disclosed by the present disclosure could avoid a heat generated by the operation of the first AISC chip and the second ASIC chip affecting the performance of other devices.

9 Claims, 3 Drawing Sheets

A-A

MICROPHONE

FIELD OF THE PRESENT DISCLOSURE

The present disclosure relates to a field of acoustic-electric conversion technology, in particular to a microphone.

DESCRIPTION OF RELATED ART

A microphone is a ring energy device that converts sound into electronic signals, and it mainly includes a housing, a circuit board enclosed with the housing to form a plurality of cavities, and a plurality of MEMS chips or a plurality of AISC chips located in a plurality of cavities, respectively.

When a plurality of MEMS chips and a plurality of AISC chips in the related technology work together, the AISC chips will generate a large amount of heat, which will be dissipated through the substrate of the circuit board or through the thermal movement of the air in the cavities, and both of these ways of dissipation of heat will affect the performance of the other devices, especially those that are susceptible to the effects of heat.

Thus, it is necessary to provide a novel microphone to solve the problem.

SUMMARY OF THE DISCLOSURE

The present disclosure is to provide a microphone which could avoid a heat generated by the operation of the first AISC chip and the second ASIC chip affecting the performance of other devices.

For achieving the object mentioned above, the disclosure provides a microphone, including a housing, a printed circuit board assembled with the housing for forming a first cavity and a second cavity communicating with the first cavity, a first chip component fixed with a side of the printed circuit board close to the housing and located in the first cavity, a second chip component fixed with the side of the printed circuit board close to the housing and located in the second cavity, and a first metal layer fixed with the side of the printed circuit board close to the housing and surrounding the first chip component and the second chip component, the first chip component includes a first ASIC chip and a first MEMS chip, the second chip component includes a second ASIC chip and a second MEMS chip, the housing is fixed with a side of the first metal layer away from the printed circuit board.

Further, the housing comprises a shell in a ring-shaped structure fixed with the first metal layer, a spacer protruding from one side of the shell to the other side of the shell and fixed with the first metal layer, and a cover both covering the side of the first metal layer away from the printed circuit board and a side of the spacer away from the printed circuit board, the cover and the printed circuit board are located on opposite sides of the housing and form a cavity with each other, the spacer divides the cavity into the first cavity and the second cavity, the microphone further comprises a second metal layer with a groove communicating with the first cavity and the second cavity and/or a third metal layer with a groove communicating with the first cavity and the second cavity, the second metal layer is both fixed with a side of the shell close to the printed circuit board and a side of the spacer close to the printed circuit board, the third metal layer is both fixed with the side of the shell away from the printed circuit board and the side of the spacer away from the printed circuit board, the second metal layer is affixed to the first metal layer, the cover covers a side of the third metal layer away from the printed circuit board.

Further, each of the second metal layer fixed with the spacer and the third metal layer fixed with the spacer is provided the groove.

Further, the total area of all of the grooves is less than 6400 $um^2$.

Further, a positive projection of the second metal layer in a direction towards the printed circuit board overlays the first metal layer and/or a positive projection of the third metal layer in a direction towards the printed circuit board overlays the first metal layer.

Further, the housing further comprises a through hole permeating the spacer and communicating with the first cavity and the second cavity, the area of the through hole is less than 6400 $um^2$.

Further, the housing is in a rectangular shape and the spacer is formed by extending from a central region on one side of the housing to a central region on the other side thereof.

Further, an inner side of the housing close to the first cavity and the second cavity is a metal sidewall.

Further, the first MEMS chip is fixed with a side of the first ASIC chip away from the printed circuit board.

Further, the printed circuit board is provided with an acoustic inlet hole permeating the printed circuit board at a position corresponding to the second MEMS chip, the acoustic inlet hole is communicating the second MEMS chip to outside.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to exemplary embodiments. To make the technical problems to be solved, and technical solutions and beneficial effects of the present disclosure more apparent, the present disclosure is described in further detail together with the figure and the embodiment. It should be understood the specific embodiment described hereby is only to explain the disclosure, not intended to limit the disclosure.

Figure 1:
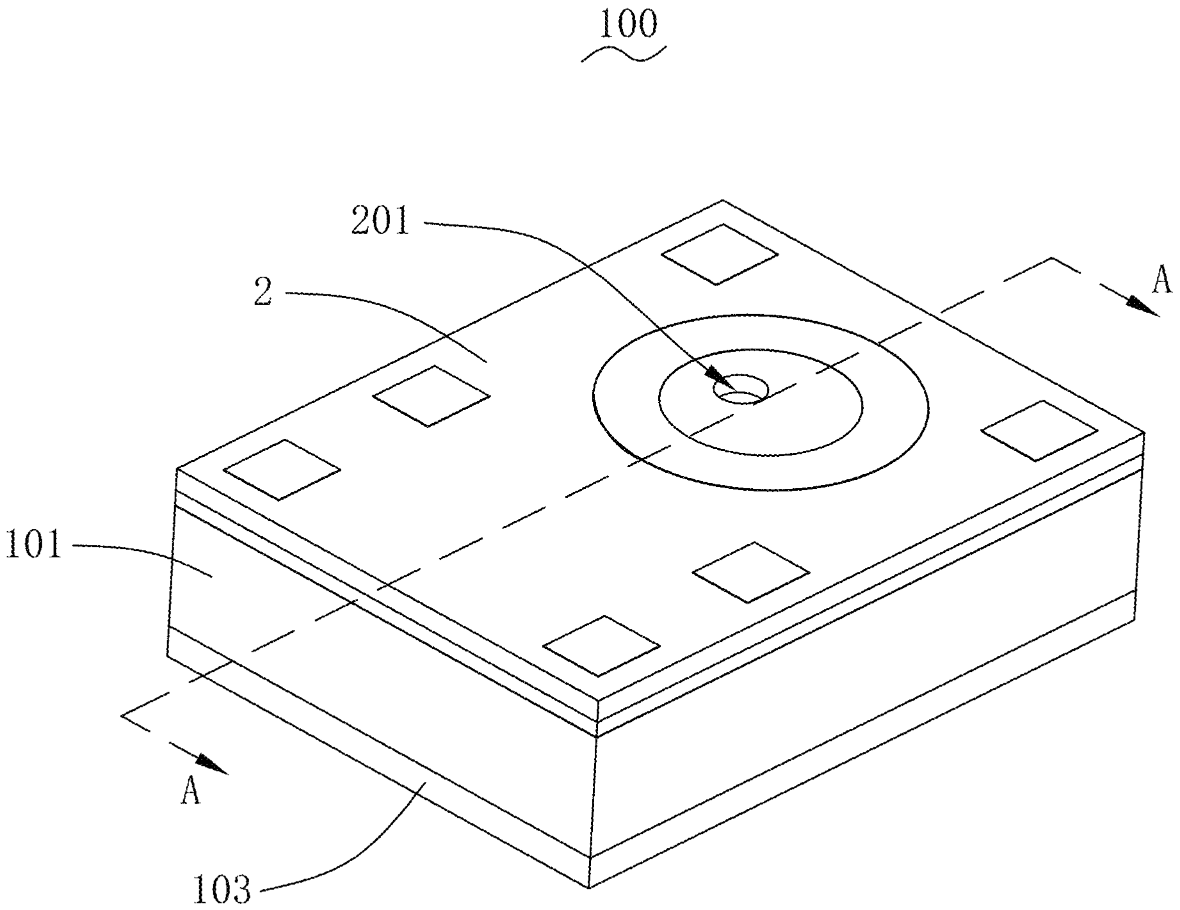
FIG. 1 is a schematic diagram of a perspective structure of a microphone to an embodiment of the present disclosure.
Figure 2:
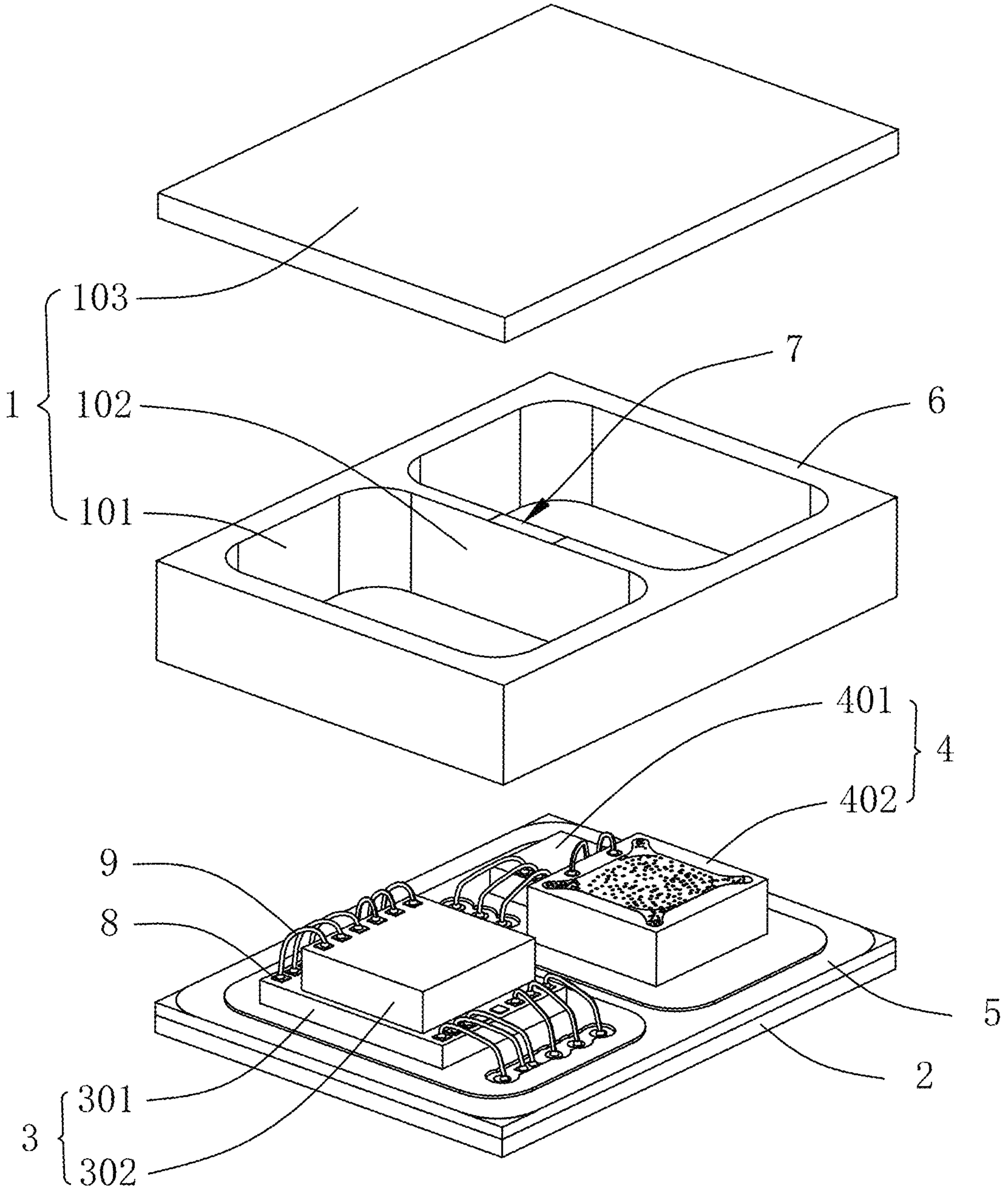
FIG. 2 is a schematic diagram of an exploded structure of a microphone to an embodiment of the present disclosure.
Figure 3:
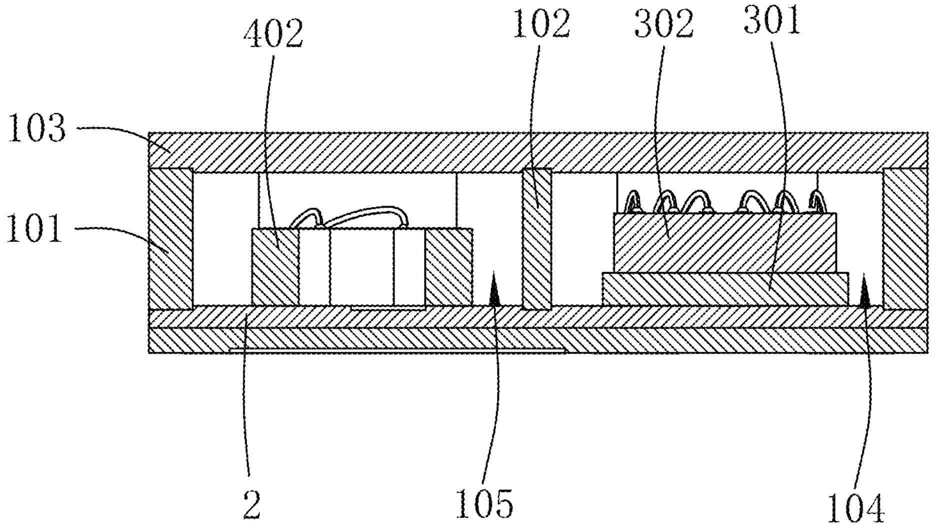
FIG. 3 is a sectional view taken along a direction A-A in FIG. 1.

Referring to FIGS. 1-3, the present disclosure discloses a microphone 100, which includes a housing 1, a printed circuit board 2 assembled with the housing 1 for forming a first cavity 104 and a second cavity 105, a first chip component 3 fixed with a side of the printed circuit board 2 close to the housing 1 and located in the first cavity 104, and a second chip component 4 fixed with a side of the printed circuit board 2 close to the housing 1 and located in the second cavity 105. The first chip component 3 includes a first ASIC chip 301 and a first MEMS chip 302, the second chip component 4 includes a second ASIC chip 401 and a second MEMS chip 402. The first cavity 104 is communicating with the second cavity 105.

In addition, an inner side of the housing 1 close to the first cavity 104 and the second cavity 105 is a metal sidewall, which will meet the RFI immunity requirements of the microphone 100.

The printed circuit board 2 is provided with an acoustic inlet hole 201 permeating the printed circuit board 2 at a position corresponding to the second MEMS chip 402, the acoustic inlet hole 201 is communicating with the second MEMS chip 402 to outside.

The first MEMS chip 302 is fixed with a side of the first ASIC chip 301 away from the printed circuit board 2.

Each of the first MEMS chip 302 and the first AISC chip 301 is provided with a plurality of pads 8 at a side away from the printed circuit board 2. The first MEMS chip 302 and the first AISC chip 301 are electrically connected via a plurality of connecting wires 9, one end of each of the plurality of connecting wires 9 is connected with one corresponding pad 8 on the first MEMS chip 302, the other end of each of the plurality of connecting wires 9 is connected with one corresponding pads 8 on the first ASIC chip 301. The printed circuit board 2 is also provided with a plurality of pads 8, and the first AISC chip 301 and the printed circuit board 2 are electrically connected via the plurality of connecting wires 9, one end of each of the plurality of connecting wires 9 is connected with one corresponding pad 8 on the first ASIC chip 301, the other end of each of the plurality of connecting wires 9 is connected with one corresponding pads 8 on the printed circuit board 2. The corresponding second MEMS chip 402, the second AISC chip 401, and the printed circuit board 2 are electrically connected to each other in the same or similar manner as the first MEMS chip 302, the first AISC chip 301, and the printed circuit board 2.

The microphone 100 further includes a first metal layer 5 fixed with a side of the printed circuit board 2 close to the housing 1, the first metal layer 5 surrounds the first chip component 3 and the second chip component 4, the housing 1 is fixed with a side of the first metal layer 5 away from the printed circuit board 2. In this way, the area of the first chip component 3 and the area of the second chip component 4 can be separated by the first metal layer 5.

The first metal layer 5 is a metal coating applied to the printed circuit board 2.

The housing 1 includes a shell 101 in a ring-shaped structure fixed with the first metal layer 5, a spacer 102 protruding from one side of the shell 101 to the other side of the shell 101 and fixed with the first metal layer 5, and a cover 103 both covering the side of the first metal layer 5 away from the printed circuit board 2 and a side of the spacer 102 away from the printed circuit board 2. The cover 103 and the printed circuit board 2 are located on opposite sides of the housing 1 and form a cavity with each other, the spacer 102 divides the cavity into the first cavity 104 and the second cavity 105. Therefore, the physical isolation of the first chip component 3 and the second chip component 4 allows different functions to be realized.

The housing 1 is in a rectangular structure, and the spacer 102 is formed by extending from a central region on one side of the housing 1 to a central region on the other side thereof. According to the actual needs, the housing 1 can also be designed in other shapes, such as triangular, oval, trapezoidal, and so on.

The housing 1 further includes a through hole permeating the spacer 102, the through hole is communicating with the first cavity 104 and the second cavity 105, the area of the through hole is less than 6400 $um^2$.

The microphone 100 further includes a second metal layer or/and a third layer 6, the second metal layer is both fixed with a side of the shell 101 close to the printed circuit board 2 and a side of the spacer 102 close to the printed circuit board 2, the third metal layer 6 is both fixed with a side of the shell 101 away from the printed circuit board 2 and a side of the spacer 102 away from the printed circuit board 2, the second metal layer is affixed and fixed to the first metal layer 5. The cover 103 is provided on a side of the third metal layer 6 away from the printed circuit board 2. The second metal layer fixed with the spacer is provided with a groove 7 or/and the third metal layer 6 fixed with the spacer 102 is provided with a groove 7, the groove 7 is communicating with the first cavity 104 and the second cavity 105. Thus the need for breathability of the microphone 100 can be realized and the amount of through holes on the housing 1 can be reduced, which will facilitate the design of the back-end application and save the cost of the back-end application.

The second metal layer and the third metal layer 6 are metal coatings applied to the shell 101 and the spacer 10, respectively.

A positive projection of the second metal layer in a direction towards the printed circuit board 2 overlays the first metal layer 5 and/or a positive projection of the third metal layer 6 in a direction towards the printed circuit board 2 overlays the first metal layer 5.

The total area of the groove is less than 6400 $um^2$.

In this embodiment, the groove 7 is only provided on the third metal layer 6 fixed with the spacer 102. According to practical needs, the groove 7 could also be only provided on the second metal layer fixed with the spacer 102, or the grooves could both be provided on the second metal layer fixed with the spacer 102 and third metal layer 6 fixed with the spacer 102.

As another optional embodiment of the cover 103, the cover 103 is fixed with a fourth metal layer corresponding to the first metal layer 5 on one side of the cover 103 close to the printed circuit board 2, and the fourth metal layer is fixed with the third metal layer 6 on the side away from the cover 103, which can be matched with the first metal layer 5 to better separate the area of the first chip component 3 and the area of the second chip component 4.

As the first ASIC chip 301 and the first MEMS chip 302 are located in the first cavity 104, the second ASIC chip 401 and the second MEMS chip 402 are located in the second cavity 105, the first metal layer 5 fixed with the printed circuit board 2 is surrounding the first chip component 3 and the second chip component 4, respectively. In this way, the area of the first chip component 3 and the area of the second chip component 4 can be separated by the first metal layer 5, which will avoid the problem of heat generated by the operation of the AISC chip affecting the performance of other devices by way of heat dissipation through thermal conduction of a substrate of the printed circuit board 2 or thermal movement of air.

It is to be understood, however, that even though numerous characteristics and advantages of the present exemplary embodiment have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms where the appended claims are expressed.

What is claimed is:

1. A microphone, comprising:

a housing;

a printed circuit board assembled with the housing for forming a first cavity and a second cavity communicating with the first cavity;

a first chip component fixed with a side of the printed circuit board close to the housing and located in the first cavity, including a first ASIC chip and a first MEMS chip;

a second chip component fixed with the side of the printed circuit board close to the housing and located in the second cavity, including a second ASIC chip and a second MEMS chip; and a first metal layer fixed with the side of the printed circuit board close to the housing and surrounding the first chip component and the second chip component; wherein the housing is fixed with a side of the first metal layer away from the printed circuit board, the housing comprises a shell in a ring-shaped structure fixed with the first metal layer, a spacer protruding from one side of the shell to the other side of the shell and fixed with the first metal layer, and a cover both covering the side of the first metal layer away from the printed circuit board and a side of the spacer away from the printed circuit board, the cover and the printed circuit board are located on opposite sides of the housing and form a cavity with each other, the spacer divides the cavity into the first cavity and the second cavity, the microphone further comprises a second metal layer with a groove communicating with the first cavity and the second cavity and/or a third metal layer with a groove communicating with the first cavity and the second cavity, the second metal layer is both fixed with a side of the shell close to the printed circuit board and a side of the spacer close to the printed circuit board, the third metal layer is both fixed with the side of the shell away from the printed circuit board and the side of the spacer away from the printed circuit board, the second metal layer is affixed to the first metal layer, the cover covers a side of the third metal layer away from the printed circuit board.

2. The microphone as described in claim 1, wherein each of the second metal layer fixed with the spacer and the third metal layer fixed with the spacer is provided the groove.

3. The microphone as described in claim 1, wherein the total area of all of the grooves is less than 6400 um2.

4. The microphone as described in claim 1, wherein a positive projection of the second metal layer in a direction towards the printed circuit board overlays the first metal layer and/or a positive projection of the third metal layer in a direction towards the printed circuit board overlays the first metal layer.

5. The microphone as described in claim 1, wherein the housing further comprises a through hole permeating the spacer and communicating with the first cavity and the second cavity, the area of the through hole is less than 6400 um2.

6. The microphone as described in claim 1, wherein the housing is in a rectangular shape and the spacer is formed by extending from a central region on one side of the housing to a central region on the other side thereof.

7. The microphone as described in claim 1, wherein an inner side of the housing close to the first cavity and the second cavity is a metal sidewall.

8. The microphone as described in claim 1, wherein the first MEMS chip is fixed with a side of the first ASIC chip away from the printed circuit board.

9. The microphone as described in claim 1, wherein the printed circuit board is provided with an acoustic inlet hole permeating the printed circuit board at a position corresponding to the second MEMS chip, the acoustic inlet hole is communicating the second MEMS chip to outside.

* * * * *